(12) United States Patent
Cheah et al.

(10) Patent No.: US 9,695,501 B2
(45) Date of Patent: Jul. 4, 2017

(54) SAPPHIRE THIN FILM COATED SUBSTRATE

(71) Applicant: Hong Kong Baptist University, Hong Kong (HK)

(72) Inventors: Kok Wai Cheah, Hong Kong (HK); King Fai Li, Hong Kong (HK); Hoi Lam Tam, Hong Kong (HK); Wing Yui Lam, Hong Kong (HK); Ka Suen Lee, Hong Kong (HK)

(73) Assignee: HONG KONG BAPTIST UNIVERSITY, Kowloon Tong, Kowloon (HK)

( * ) Notice: Subject to any disclaimer, the term of this patent is extended or adjusted under 35 U.S.C. 154(b) by 113 days.

(21) Appl. No.: 14/642,742

(22) Filed: Mar. 9, 2015

(65) Prior Publication Data

US 2016/0076135 A1    Mar. 17, 2016

Related U.S. Application Data

(60) Provisional application No. 62/049,364, filed on Sep. 12, 2014.

(51) Int. Cl.
| | |
|---|---|
| *C23C 14/00* | (2006.01) |
| *C23C 14/32* | (2006.01) |
| *C23C 14/08* | (2006.01) |
| *C03C 17/00* | (2006.01) |
| *C23C 14/58* | (2006.01) |
| *C01F 7/02* | (2006.01) |
| *B05D 3/02* | (2006.01) |

(52) U.S. Cl.
CPC ............ *C23C 14/081* (2013.01); *C03C 17/00* (2013.01); *C23C 14/5806* (2013.01)

(58) Field of Classification Search
CPC ........ C23C 14/081; C23C 14/30; C23C 14/34
USPC ................... 117/95, 106; 204/192.1; 216/95; 423/625; 427/372.2, 585
See application file for complete search history.

(56) References Cited

U.S. PATENT DOCUMENTS

2013/0270534 A1* 10/2013 Hwang ............... H01L 51/0533
257/40
2014/0116329 A1† 5/2014 Chaudhari

OTHER PUBLICATIONS

Ashok Chaudhari, R.D.Vispute, Thomas M.Murray, Harry Efstathiadis, Crystalline Al2O3 on buffered soda-lime glass by e-beam, Materials Letters 136(2014) 407-410, 2014, Elsevie rB.V. Allrights reserved.*

(Continued)

*Primary Examiner* — Bijan Ahvazi
(74) *Attorney, Agent, or Firm* — Idea Intellectual Limited; Margaret A. Burke; Sam T. Yip

(57) ABSTRACT

A method to deposit a layer of harder thin film substrate onto a softer substrate. In particular, the present invention provides a method to deposit a layer of sapphire thin film on to a softer substrate e.g. quartz, fused silica, silicon and (toughen) glass. This combination is better than pure sapphire substrate.

17 Claims, 12 Drawing Sheets

(56) References Cited

OTHER PUBLICATIONS

Robert W. Eason, Louise M. Hickey, Sakellaris Mailis, I\iroslav Jelinek, Keith Rogers, Growth of Sapphire thin films by pulsed laser deposition, submitted for ULF-LENS annual report 1994/1995, pp. 1-15.*

Chaudhari et al. "Extremely High Textured MgO[111] Crystalline Films on Soda-Line Glass by e-beam", pp. 47-49, Jan. 2014, Elsevier, USA.†

Chaudhari et al. "Crystalline Al2O3 on Buffered Soda-Lime Glass by e-beam", pp. 407-410, Aug. 2014, Elsevier, USA.†

\* cited by examiner
† cited by third party

| Mohs hardness | Mineral | Chemical formula | Absolute hardness | Image |
|---|---|---|---|---|
| 1 | Talc | $Mg_3Si_4O_{10}(OH)_2$ | 1 |  |
| 2 | Gypsum | $CaSO_4 \cdot 2H_2O$ | 3 |  |
| 3 | Calcite | $CaCO_3$ | 9 |  |
| 4 | Fluorite | $CaF_2$ | 21 |  |
| 5 | Apatite | $Ca_5(PO_4)_3(OH^-,Cl^-,F^-)$ | 48 |  |
| 6 | Feldspar | $KAlSi_3O_8$ | 72 |  |
| 7 | Quartz | $SiO_2$ | 100 |  |
| 8 | Topaz | $Al_2SiO_4(OH^-,F^-)_2$ | 200 |  |
| 9 | Corundum /Sapphire | $Al_2O_3$ | 400 |  |
| 10 | Diamond | C | 1600 |  |

SAPPHIRE THIN FILM COATED SUBSTRATE

CROSS-REFERENCE TO THE RELATED APPLICATIONS

This application claims the benefit of U.S. Provisional Patent Application Ser. No. 62/049,364 filed on Sep. 12, 2014, which is hereby incorporated by reference in its entirety.

FIELD OF THE INVENTION

The present invention relates to a method to deposit a layer of harder thin film substrate onto a softer substrate. In particular, the present invention provides a method to deposit a layer of sapphire thin film on to a softer substrate e.g. quartz, fused silica, silicon and (toughen) glass. This combination is better than pure sapphire substrate. In nature, the harder the materials, the more fragile they are, thus, sapphire substrate is hard to scratch but it is easy to shatter, and the vice versa is also often true wherein quartz substrate is easier to scratch but it is less fragile than sapphire substrate. Therefore, depositing a harder thin film substrate on a softer substrate gives the best of both worlds. Softer substrates are less fragile, have good mechanical performance and cost less. The function of anti-scratch is to achieve by using the harder thin film substrate.

BACKGROUND OF THE INVENTION

Sapphire is presently being actively considered as screen for smart phones and tablets. It is second hardest material after diamond so using it as screen would mean the smart phone/tablet has a superior scratch and crack resistant screen. Sapphire screen is already being featured on iPhone 5S TouchID scanner and camera lens on the rear of the phone. Vertu, the luxury smartphone manufacturer is also developing sapphire screen. However, since sapphire is the second hardest material, it is also difficult to be cut and polished. Coupled by the fact that the growth of a large size of single crystal sapphire is time consuming, this results in long fabrication time and high fabrication cost. The high fabrication cost and long fabrication time of sapphire screen limit the Apple Inc. use of such sapphire screen only for Apple Watch.

Current popular 'tough' screen material use is Gorilla Glass from Corning which is being used in over 1.5 billion devices. Sapphire is in fact harder to scratch than Gorilla Glass and this is being verified by several third party institutes such as Center for Advanced Ceramic Technology at Alfred University's Kazuo Inamori School of Engineering. On the Mohs scale of hardness, the newest Gorilla Glass only scores 6.5 Mohs which is below the Mohs value of mineral quartz such that Gorilla Glass is still easy to be scratched by sand and metals. Sapphire is the second hardest naturally occurring material on the planet, behind diamond which scores 10 on the Mohs scale of mineral hardness. This test matches one substance's ability to scratch another—and so it is a better indicator of scratch resistance than shatter resistance.

Mohs hardness test is to characterize the scratch resistance of minerals through the ability of a harder material to scratch a softer material. It matches one substance's ability to scratch another, and so is a better indicator of scratch resistance than shatter resistance. This is shown in FIG. 1.

Following is quotations from 'Display Review' on sapphire screen:

"Chemically strengthened glass can be excellent, but sapphire is better in terms of hardness, strength, and toughness" Hall explained, adding "the fracture toughness of sapphire should be around four times greater than Gorilla Glass—about 3 MPa-m0.5 versus 0.7 MPa-m0.5, respectively."

This comes with some rather large downsides though. Sapphire is both heavier at 3.98 g per cubic cm (compared to the 2.54 g of Gorilla Glass) as well as refracting light slightly more.

So apart from being heavier, sapphire being second hardest material is also difficult material to cut and polish. Growing single crystal sapphire is time consuming especially when the diameter size is large (>6 inches), this is technically very challenging. Therefore the fabrication cost is high and fabrication time is long for sapphire screen. It is an objective of the present invention to provide fabrication means of sapphire screen materials that is quick to fabricate and low in cost while having the following advantages:

Harder than any hardened glass;
Less possibility of fragmentation than pure sapphire screen;
Lighter weight than pure sapphire screen;
Higher transparency than pure sapphire screen.

SUMMARY OF THE INVENTION

In accordance with a first aspect of the present invention, there is provided a method to deposit a layer of harder thin film substrate onto a softer substrate. In particular, the present invention provides a method to deposit a layer of sapphire thin film onto a softer substrate e.g. quartz, fused silica, silicon and (toughen) glass. This combination is better than pure sapphire substrate.

In accordance with a second aspect of the present invention there is provided a method for coating sapphire on to substrate comprising:
 at least one deposition process wherein sapphire is deposited on to at least one substrate to form a sapphire coated substrate; and
 at least one anneal process wherein said sapphire coated substrate is annealed under an annealing temperature ranging between 500° C. and 2040° C. for an effective duration of time.

In a first embodiment of the second aspect of the present invention, there is provided the method wherein said at least one substrate comprises at least one material with a Mohs value less than that of sapphire, wherein said at least one material comprises quartz, fused silica, silicon and/or (toughen) glass.

In a second embodiment of the second aspect of the present invention, there is provided the method wherein said at least one deposition process is comprising e-beam deposition or sputtering deposition.

In a third embodiment of the second aspect of the present invention, there is provided the method wherein said sapphire is deposited on to said at least one substrate to form at least one sapphire thin film, wherein the thickness of said at least one substrate is of one or more orders of magnitude greater than the thickness of said at least one sapphire thin film, preferably the thickness of said at least one sapphire thin film is about $1/1000$ of the thickness of said at least one substrate. Furthermore, wherein said at least one sapphire thin film has a thickness between 150 nm and 600 nm, preferably between 150 nm and 300 nm.

In a fourth embodiment of the second aspect of the present invention, there is provided the method wherein said effective duration of time is no less than 30 minutes.

In a fifth embodiment of the second aspect of the present invention, there is provided the method wherein said effective duration of time is no more than 2 hours.

In a sixth embodiment of the second aspect of the present invention, there is provided the method wherein said annealing temperature ranges between 850° C. and 1300° C., preferably between 1150° C. and 1300° C.

In accordance with a third aspect of the present invention, there is provided a method for protecting a surface of a substrate by coating said surface with sapphire using the method according to the second aspect of the present invention, wherein said surface allows light to pass through.

In accordance with a fourth aspect of the present invention, there is provided a screen fabricated by using the method according to the second aspect of the present invention, for use in displays, wherein said screen is used as one or more interfaces in electronic or digital devices, and wherein said screen is scratch resistant, shatter resistant, light in weight and/or allows light to pass through.

Those skilled in the art will appreciate that the invention described herein is susceptible to variations and modifications other than those specifically described.

The invention includes all such variation and modifications. The invention also includes all of the steps and features referred to or indicated in the specification, individually or collectively, and any and all combinations or any two or more of the steps or features.

Other aspects and advantages of the invention will be apparent to those skilled in the art from a review of the ensuing description.

BRIEF DESCRIPTION OF THE DRAWINGS

The above and other objects and features of the present invention will become apparent from the following description of the invention, when taken in conjunction with the accompanying drawings, in which.

DETAILED DESCRIPTION OF THE INVENTION

Figure 1:
FIG. 1 shows the Mohs scale of mineral hardness.
Figure 1:
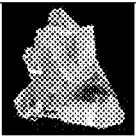
Figure 1:
Figure 1:
Figure 1:
Figure 1:
Figure 1:
Figure 1:
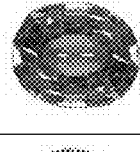
Figure 1:
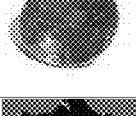
Figure 1:

The present invention is not to be limited in scope by any of the specific embodiments described herein. The following embodiments are presented for exemplification only.

Without wishing to be bound by theory, the inventors have discovered through their trials, experimentations and research that to accomplish the task of depositing a layer of harder thin film substrate onto a softer substrate e.g. quartz, fused silica, silicon and (toughen) glass. This combination is better than pure sapphire substrate. In nature, the harder the materials, the more fragile they are, thus, sapphire substrate is hard to scratch but it is easy to shatter, and the vice versa is also often true wherein quartz substrate is easier to scratch but it is less fragile than sapphire substrate. Therefore, depositing a harder thin film substrate on a softer substrate gives the best of both worlds. Softer substrates are less fragile, have good mechanical performance and cost less. The function of anti-scratch is to achieve by using the harder thin film substrate.

In accordance with a first aspect of the present invention, there is provided a method to deposit a layer of harder thin film substrate onto a softer substrate. In particular, the present invention provides a method to deposit a layer of sapphire thin film onto a softer substrate e.g. quartz, fused silica, silicon and (toughen) glass. This combination is better than pure sapphire substrate.

In accordance with a second aspect of the present invention, there is provided a method for coating sapphire on to substrate comprising:

at least one deposition process wherein sapphire is deposited on to at least one substrate to form a sapphire coated substrate, and at least one anneal process wherein said sapphire coated substrate is annealed under an annealing temperature ranging between 500° C. and 2040° C. for an effective duration of time.

In a first embodiment of the second aspect of the present invention, there is provided the method wherein said at least one substrate comprising at least one material with a Mohs value less than that of sapphire, wherein said at least one material comprises quartz, fused silica, silicon and/or (toughen) glass.

In a second embodiment of the second aspect of the present invention, there is provided the method wherein said at least one deposition process is comprising e-beam deposition or sputtering deposition.

In a third embodiment of the second aspect of the present invention, there is provided the method wherein said sapphire is deposited on to said at least one substrate to form at least one sapphire thin film, wherein the thickness of said at least one substrate is of one or more orders of magnitude greater than the thickness of said at least one sapphire thin film, preferably the thickness of said at least one sapphire thin film is about 1/1000 of the thickness of said at least one substrate. Furthermore, wherein said at least one sapphire thin film has a thickness between 150 nm and 600 nm, preferably between 150 nm and 300 nm.

In a fourth embodiment of the second aspect of the present invention, there is provided the method wherein said effective duration of time is no less than 30 minutes.

In a fifth embodiment of the second aspect of the present invention, there is provided the method wherein said effective duration of time is no more than 2 hours.

In a sixth embodiment of the second aspect of the present invention, there is provided the method wherein said annealing temperature ranges between 850° C. and 1300° C., preferably between 1150° C. and 1300° C.

In accordance with a third aspect of the present invention, there is provided a method for protecting a surface of a substrate by coating said surface with sapphire using the method according to the second aspect of the present invention, wherein said surface allows light to pass through.

In accordance with a fourth aspect of the present invention, there is provided a screen fabricated by using the method according to the second aspect of the present invention, for use in displays, wherein said screen is used as one or more interface in electronic or digital devices, and wherein said screen is scratch resistant, shatter resistant, light in weight and/or allows light to pass through.

DEFINITIONS

For clarity and completeness the following definition of terms used in this disclosure:

The word "sapphire" when used herein refers to the material or substrate that is also known as a gemstone variety of the mineral corundum including those with different impurities in said material or substrate, an aluminium oxide (alpha-$Al_2O_3$), or alumina. Pure corundum (aluminum oxide) is colorless, or corundum with ~0.01% titanium. The various sapphire colors result from the presence of different chemical impurities or trace elements are:—

Blue sapphire is typically colored by traces of iron and titanium (only 0.01%).
The combination of iron and chromium produces yellow or orange sapphire.
Chromium alone produces pink or red (ruby); at least 1% chromium for deep red ruby.
Iron alone produces a weak yellow or green.
Violet or purple sapphire is colored by vanadium.

The word "harder" when used herein refers to a relative measure of the hardness of a material when compared to another. For clarity, when a first material or substrate that is defined as harder than a second material or substrate, the Mohs value for the first material or substrate will be higher than the Mohs value for the second material or substrate.

The word "softer" when used herein refers to a relative measure of the hardness of a material when compared to another. For clarity, when a first material or substrate that is defined as softer than a second material or substrate, the Mohs value for the first material or substrate will be lower than the Mohs value for the second material or substrate.

The word "screen" when used as a noun herein refers to a cover-glass/a cover-screen/a cover-window/a display screen/a display window/a cover-surface/a cover plate of an apparatus. For clarity, while in many instances a screen on a given apparatus has a dual function of displaying an interface of the apparatus and protecting the surface of the apparatus, wherein for such instances good light transmittance is a required feature of said screen; this is not a must. In other instances where only the function of providing surface protection is required, light transmittance of the screen is not a must.

In one embodiment of the present invention, there is provided a method to develop a transparent screen which is harder and better than Gorilla Glass and comparable to pure sapphire screen but with the following advantages:

Harder than any hardened glass;
Less possibility of fragmentation than pure sapphire screen;
Lighter weight than pure sapphire screen;
Higher transparency than pure sapphire screen.

Figure 2:
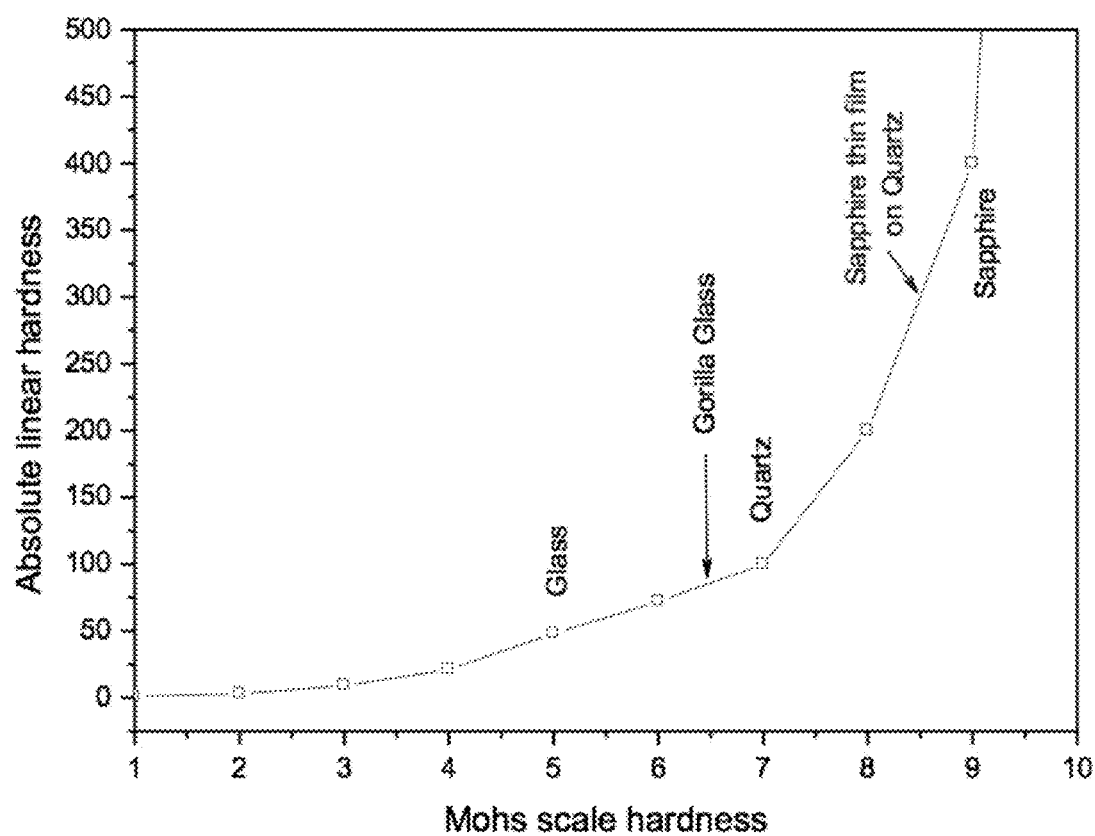
FIG. 2 shows the top-surface hardness of "Sapphire thin film on Quartz" when compared to ordinary glass, Gorilla Glass, quartz and pure sapphire.

In one embodiment of the present invention, there is provided a method to deposit a sapphire thin film on quartz substrate. With post-deposit treatment such as thermal annealing, an embodiment of the present invention has achieved top-surface hardness up to 8-8.5 Mohs, which is close to sapphire single crystal hardness of 9 Mohs. One embodiment of the present invention is herein known as "Sapphire thin film on Quartz". FIG. 2 shows the top-surface hardness of "Sapphire thin film on Quartz" when compared to ordinary glass, Gorilla Glass, quartz and pure sapphire.

Quartz substrate itself is the single crystal of $SiO_2$ with a higher Mohs value than glass. Moreover, its melting point is 1610° C. which can resist high annealing temperatures. Furthermore, the substrate can be cut to the desired size onto which an embodiment of the present invention can then deposit the sapphire thin film. The thickness of the deposited sapphire thin film is just 1/1000 of the quartz substrate. The cost of synthetic quartz crystal is relatively low (which is only less US$10/kg at the time the present invention is disclosed herein). So in an embodiment of the present invention, the fabrication cost and fabrication time is significantly reduced comparing to the fabrication of pure sapphire substrate.

FEATURES AND BENEFITS OF THE PRESENT INVENTION

Higher Hardness than Hardened Glass

In one embodiment of the present invention, the developed Sapphire thin film on Quartz has a maximum value of 8.5 Mohs in top-surface hardness. Recent Gorilla Glass used in smart-phone screen only scores about 6.5 Mohs in hardness value and natural quartz substrate is 7 Mohs in hardness value. Therefore, the present invention has a significant improvement in top-surface hardness comparing to recent technology. The Sapphire thin film on Quartz has a hardness value of 8.5 Mohs which is very close to pure sapphire's hardness value of 9 Mohs, and the Sapphire thin film on Quartz has the merits of lower fabrication cost and requires a less fabrication time.

Less Fragmented, Lighter than Sapphire

In nature, the harder the materials, the more fragile they are, thus, sapphire substrate is hard to scratch but it is easy to shatter, and the vice versa is also often true. Quartz has comparatively low elastic modulus, making it far more shock resistant than sapphire.

Moreover, in one embodiment of the present invention, the deposited sapphire thin film is very thin compared to quartz substrate wherein the deposited sapphire thin film is only 1/1000 of the quartz substrate in thickness. Therefore, the overall weight of sapphire thin film on quartz is almost the same as quartz substrate which is only 66.6% (or 2/3) of the weight of pure sapphire substrate for the same thickness. This is because the density of quartz is only 2.65 g/cm$^3$ while sapphire is 3.98 g/cm³ and Gorilla Glass is 2.54 g/cm³. In other words, quartz substrate is only heavier than Gorilla Glass by 4.3% but pure sapphire substrate is roughly 1.5 times heavier than Gorilla Glass and quartz. Table 1 shows the comparison among the density of quartz, Gorilla Glass and pure sapphire.

TABLE 1

Comparison of density of Gorilla glass, quartz and pure sapphire, and their percentage differences.

| Materials | Density | Difference |
|---|---|---|
| Gorilla Glass | 2.54 g/cm³ | 100% |
| Quartz | 2.65 g/cm³ | 104.3% |
| Pure Sapphire | 3.98 g/cm³ | 156.7% |

Recently published U.S. patent application Ser. No. 13/783,262, submitted by Apple Inc. also indicates that it has devised a way to fuse sapphire and glass layers together that creates a sapphire laminated glass to combine the durability of sapphire with the weight and flexibility advantages of glass. However, polishing a larger area (>6 inches) and thin (<0.3 mm) sapphire substrate is very challenging. Therefore, using Sapphire thin film on Quartz is the best combination for screen with lighter weight, higher top-surface hardness, less fragmented substrate.

Higher Transparency than Pure Sapphire

Figure 3:
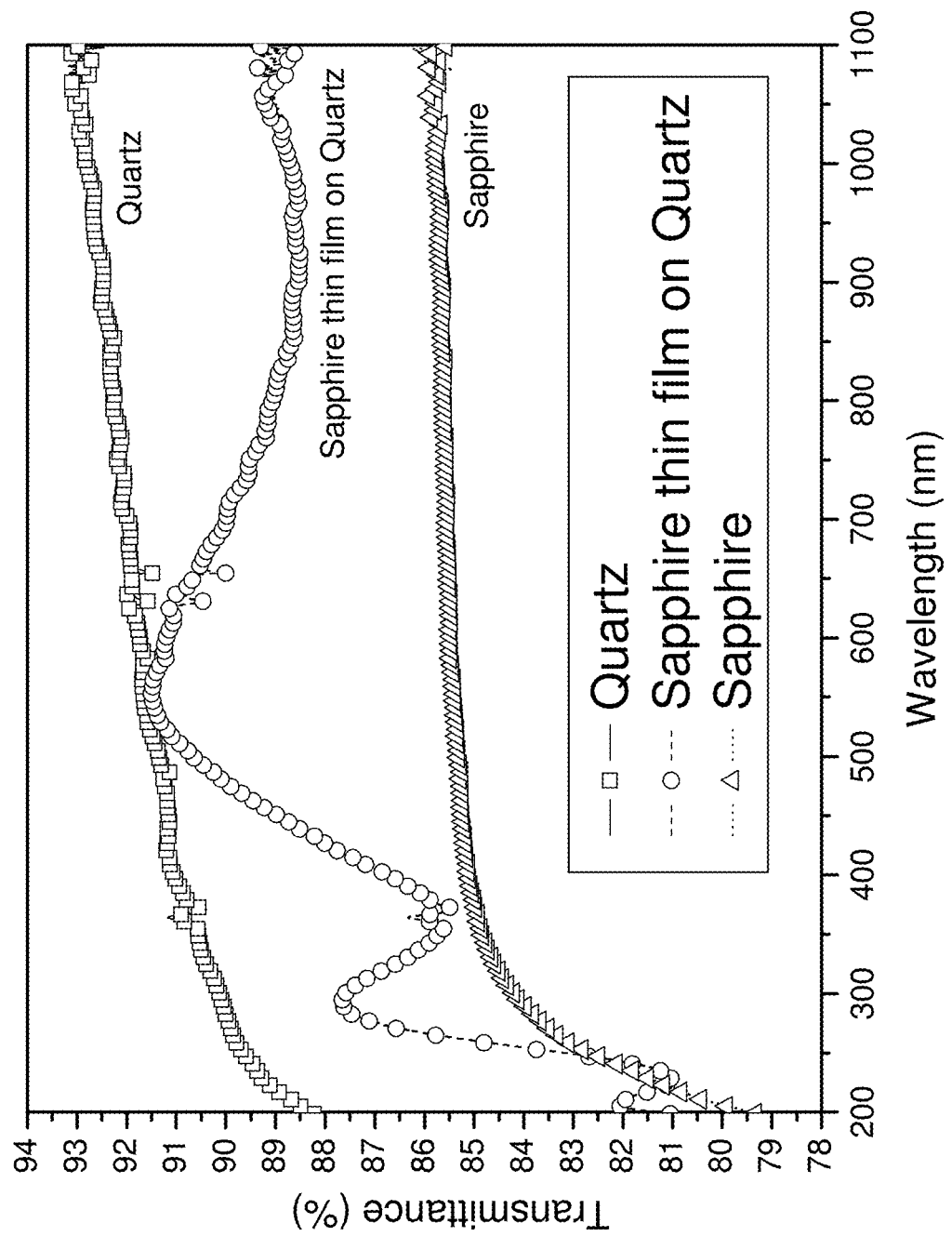
FIG. 3 shows the light transmittance of quartz, Sapphire thin film on Quartz and pure sapphire.

Since the refractive index of sapphire crystal, quartz crystal and Gorilla Glass are 1.76, 1.54 and 1.5 respectively, the overall light transmission of them are 85%, 91% and 92% due to the Fresnel's reflection loss. That means there is a small trade-off between light transmission and durability. Sapphire transmits less light which can results in either dimmer devices or shorter device battery life. When more light is transmitted, then more energy is saved and the device battery life would be longer. FIG. 3 shows the light transmittance of quartz, Sapphire thin film on Quartz and pure sapphire.

Most crystal, including sapphire and quartz, has birefringence problem. By comparing their refractive index for ordinary ray and extraordinary ray ($n_o$ and $n_e$), the magnitude of the difference $\Delta n$ is quantified by the birefringence. Moreover, the values of $\Delta n$ for one embodiment of the present invention are also small such that the birefringence problem is not serious for application with thinner substrate thickness (~1 mm). For examples, pure sapphire is used as the camera cover lens in Apple iPhone 5S which there is not any blurred images reported. Table 2 shows the refractive index of ordinary ray and extraordinary ray ($n_o$ and $n_e$), their differences $\Delta n$ in birefringence for quartz and sapphire.

TABLE 2

Refractive indices of ordinary ray and extraordinary ray ($n_o$ and $n_e$), their differences $\Delta n$ for quartz and sapphire.

| Materials | Formula | $n_o$ | $n_e$ | $\Delta n$ |
|---|---|---|---|---|
| Quartz | SiO₂ | 1.544 | 1.553 | +0.009 |
| Sapphire | Al₂O₃ | 1.768 | 1.760 | −0.008 |

Shorter Fabrication Time and Lower Fabrication Cost than Pure Sapphire

Recently, both synthetic sapphire and quartz single crystals are grown and commercially available. Since sapphire has a higher melting point than quartz, the growth of sapphire is more difficult and has a higher cost. More importantly, the time to grow sapphire is much longer than quartz. Growing larger than 6 inches of sapphire is also challenging and only a limited number of companies can achieve this. Therefore, it limits the production quantity such that production cost of sapphire substrate is higher than quartz. Table 3 shows the formula, melting point and Mohs hardness value for quartz and sapphire.

TABLE 3

The formula, melting point and Mohs hardness value for quartz and sapphire.

| Materials | Formula | Melting point | Mohs hardness |
|---|---|---|---|
| Quartz | SiO₂ | 1610° C. | 7 |
| Sapphire | Al₂O₃ | 2040° C. | 9 |

Another challenge in the use of pure sapphire is that sapphire crystal with hardness value of 9 Mohs, is very difficult to cut and polish. Up to now, polishing a larger area (>6 inches) and thin (<0.3 mm) sapphire substrate is very challenging. The successful rate is not too high and this prevents the price of sapphire substrate from dropping too much even though a larger number of sapphire crystal growth furnaces are now in operation. Corning has claimed that sapphire screen can cost up to 10 times as much as Gorilla Glass. In contrast, quartz possesses a hardness value of 7 Mohs, and it is easier to cut and polish. Moreover, the cost of synthetic quartz crystal is comparatively less expensive (only costs less US$10/kg at the time of the present disclosure).

Therefore, the additional cost of Sapphire thin film on Quartz is the deposition of the sapphire thin film on the quartz substrate and the post-treatment of the Sapphire thin film on Quartz. In one embodiment of the present invention, when all conditions are optimized, the process of mass production can be fast and the cost is low.

Figure 4:
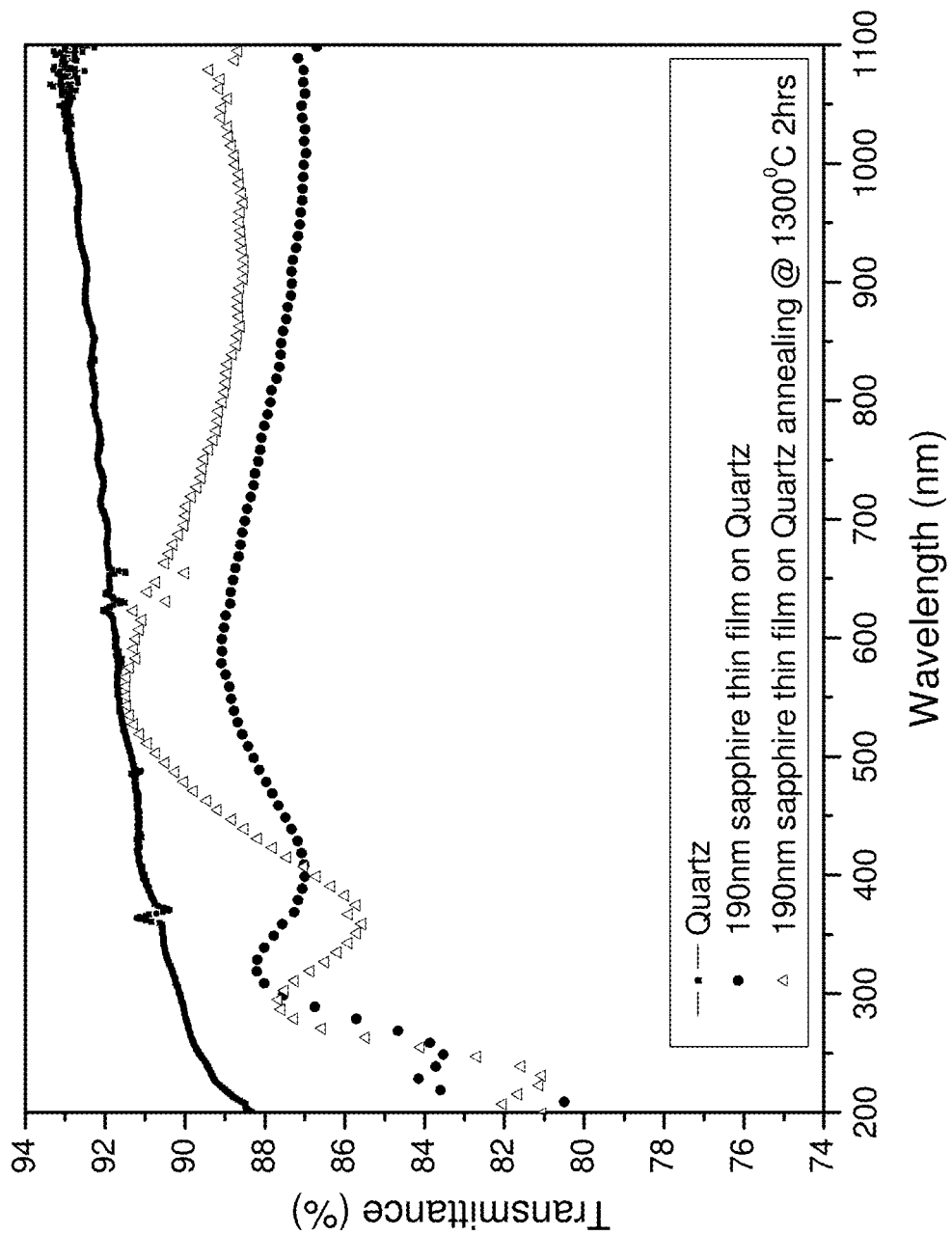
FIG. 4 shows the light transmission of quartz and 190 nm Sapphire thin film on Quartz with and without annealing at 1300° C. for 2 hours.

In one embodiment of the present invention, there is provided a method to deposit a harder sapphire thin film on quartz substrate. The thin film thickness is in the range of 150 nm-1000 nm. With post-deposit treatment such as thermal annealing at 500° C.-1300° C., this embodiment of the present invention has achieved hardness of 8-8.5 Mohs which is very close to sapphire single crystal hardness of 9 Mohs. In another embodiment of the present invention, there is provided sapphire thin film with thickness of 150 nm-500 nm with an achieved hardness value of 8-8.5 Mohs and also good optical performance with low scattering lost. The annealing temperature is from 1150 to 1300° C., which is very close to sapphire single crystal hardness of 9 Mohs. FIG. 4 shows the light transmission of quartz and 190 nm Sapphire thin film on Quartz with and without annealing at 1300° C. with 2 hours. Therefore in terms of hardness, the Sapphire thin film on Quartz is comparable to that of pure sapphire screen, and its weight is almost the same as that of glass/quartz substrate which is roughly 66.6% the weight of pure sapphire substrate since the density of quartz is only 2.65 g/cm³ while sapphire is 3.98 g/cm³. Since one can cut the substrate to the desired size then deposit the sapphire thin film, the fabrication cost and time is significantly reduced comparing to that of pure sapphire substrate.

In fact, the value of hardness for sapphire thin film by e-beam deposition is not too high. In one embodiment of the present invention, the value of hardness was measured to be less than 7 Mohs. However, after doing thermal annealing process, the thin film hardness is significantly improved. One embodiment of the present invention has found that the sapphire thin film was softened as annealing at 1300° C. with 2 hours. The film thickness was shrunk about 10% and the film hardness was improved to 8-8.5 Mohs. Since, the quartz substrate is single crystal of $SiO_2$ with melting point of 1610° C., it can resist the high annealing temperature. Therefore, the hardness of annealed sapphire thin film on quartz substrate can attain 8.5 Mohs. FIG. 4 shows the transmission of quartz and 190 nm Sapphire thin film on Quartz with and without annealing at 1300° C. for 2 hours.

Moreover, in other embodiments of the present invention, the annealing process of sapphire thin film were done on other substrates. For examples, 1000° C. annealed sapphire thin film on fused silica substrate and 500° C. annealed sapphire thin film on glass substrate, their hardness was measured.

Electron beam (E-beam) and sputtering depositions are two most popular methods to deposit sapphire thin film onto the quartz and other relevant substrates. In embodiments of the present invention, these two common deposition methods are used.

Sapphire Thin Film by e-Beam Deposition

The summary points on sapphire thin film deposition on a given substrate by e-beam deposition is given as follows:
  The deposition of sapphire thin film is using e-beam evaporation since aluminum oxide has very high melting point at 2040° C. The white pellets or colorless crystal in small size of pure aluminum oxide are used as the e-beam evaporating sources.
  The substrates are perpendicularly stuck on the sample holder far away the evaporation source 450 mm. The sample holder is rotated at 1-2 RPM when the deposition takes place.
  The base vacuum of evaporation chamber is less than $5 \times 10^{-6}$ torr and the vacuum keeps below $1 \times 10^{-5}$ torr when the deposition takes place.
  The thickness of film deposited on substrates is about 150 nm to 1000 nm. The deposition rate is about 1-5 Å/s. The substrate during deposition is without external cooling or heating. The film thicknesses are measured by ellipsometry method.
  Higher temperature film deposition is possible from room temperature to 1000° C.

A more detailed description on the process of e-beam deposition for sapphire thin film on another substrate is given as follows:
  1) The deposition of sapphire thin film is using e-beam evaporation since aluminum oxide has high melting point at 2040° C. The aluminum oxide pellets are used as the e-beam evaporation source.
  2) The coated substrates are perpendicularly stuck on the sample holder far away the evaporation source 450 mm. The sample holder is rotated at 2 RPM when the deposition takes place.
  3) The thickness of film deposited on substrates is about 190 nm to 1000 nm. The deposition rate is about 1 Å/s. The substrate during deposition is without external cooling or heating. The film thicknesses are measured by ellipsometry method.
  4) After deposition of sapphire thin film on substrates, they are annealed by a furnace from 500° C. to 1300° C. The temperature raising speed is 5° C./min and the decline speed is 1° C./min. The time is ranged from 30 minutes to 2 hours keeping on the particular thermal annealing temperature.
  5) The deposition substrates are including quartz, fused silica and (toughen) glass. Their melting points are 1610° C., 1140° C. and 550° C. respectively. The annealing temperatures of sapphire thin film coated on them are 1300° C., 1000° C. and 500° C. respectively.
  6) The transmission of quartz and 190 nm sapphire thin film on quartz with and without annealing at 1300° C. with 2 hours are showed in FIG. 4. The light transmission percentage in whole visible region from 400 nm-700 nm is greater than 86.7% and maximally 91.5% at 550 nm while for pure sapphire substrate the light transmission percentage is only 85-86%. More light transmitted indicates more energy saved from backlight-source of display panel, so such that the device battery life would be longer.

Annealing Process

After deposition of sapphire thin film on substrates, they are annealed in a furnace from 500° C. to 1300° C. The temperature raising rate is 5° C./min and the decline rate is 1° C./min. The annealing time is from 30 minutes to 2 hours maintaining at a particular thermal annealing temperature. Multiple-steps annealing with different temperatures within the aforementioned range are also used to enhance the hardness and also reduce the micro-crack of thin film. Table 4 shows the surface hardness and XRD characteristic peaks at different annealing temperatures prepared by e-beam deposition. The table also shows various crystalline phases of sapphire present in the films; most common phases are alpha (α), theta (θ) and delta (δ).

TABLE 4

The surface hardness and XRD characteristic peaks at different annealing temperatures prepared by e-beam deposition.

| Annealing temperature (° C.) | Surface hardness (Mohs) | XRD peaks (phase) |
|---|---|---|
| No annealing | 5.5 | No |
| 500-850 | 6-7 | No |
| 850-1150 | 7-8 | theta & delta |
| 1150-1300 | 8-8.5 | theta & delta |

Table 4 shows the changes of surface hardness of sapphire thin film as a function of annealing temperature varies from 500° C. to 1300° C. In fact, the initial value of hardness of e-beam deposited sapphire thin film without annealing by is about 5.5 Mohs. However, after doing thermal annealing process, the film hardness is significantly improved. For annealing temperature in the range 500° C.-850° C., 850° C.-1150° C. and 1150° C.-1300° C., the hardness values of sapphire thin film on quartz has 6-7 Mohs, 7-8 Mohs and 8-8.5 Mohs in hardness scale respectively.

Figure 5:
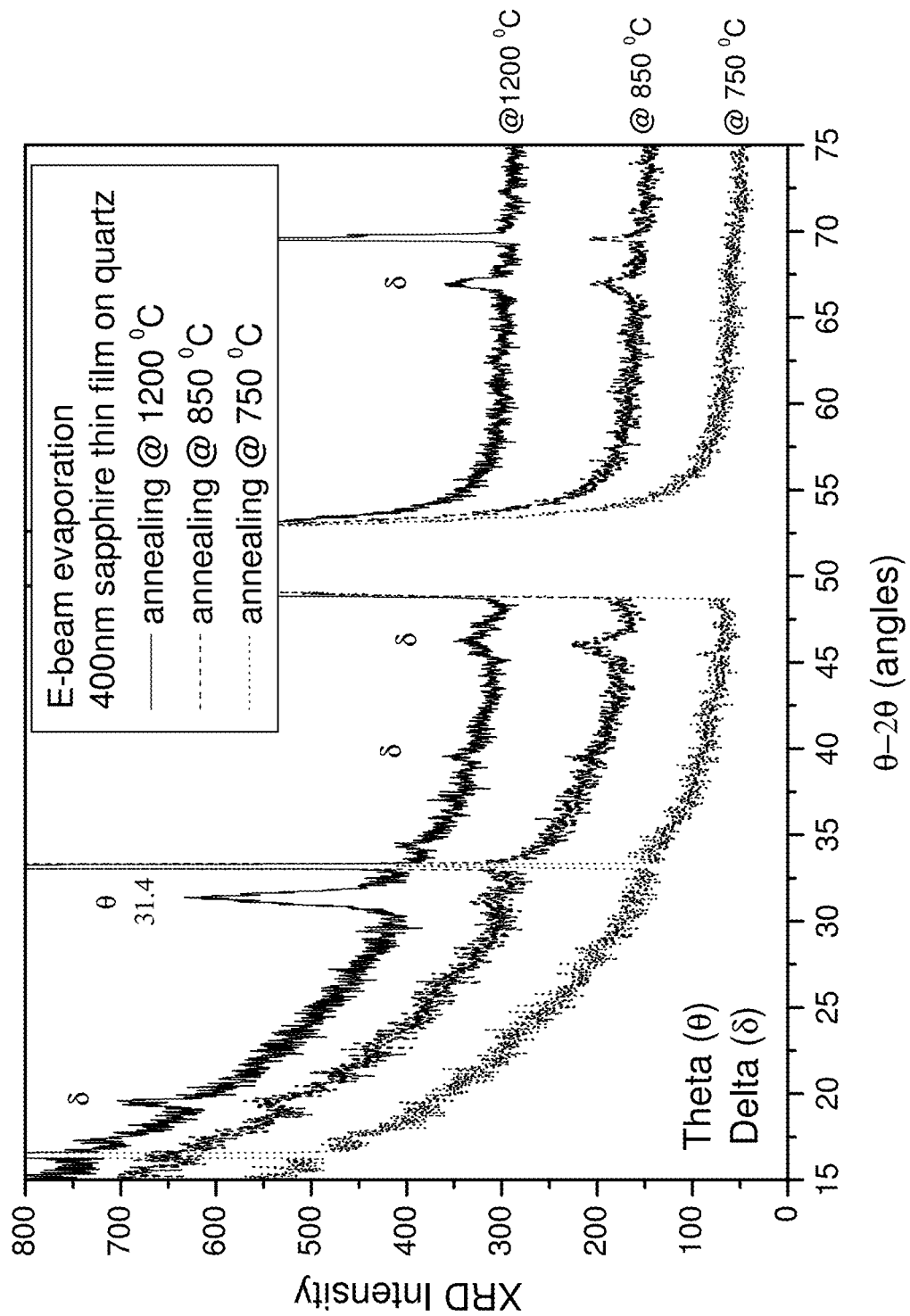
FIG. 5 shows XRD results for the 400 nm sapphire thin film on quartz annealed at 750° C., 850° C. and 1200° C. for 2 hours.

FIG. 5 shows XRD results for the 400 nm sapphire thin film on quartz annealed at 750° C., 850° C. and 1200° C. for 2 hours. When the annealing temperature is greater than 850° C., the film starts to partially crystallize. The appearance of new XRD peaks corresponds to the mixture of theta and delta structural phases of aluminum oxide.

When annealing above 1300° C., the film would start to develop some larger crystallites that can significantly scatter visible light; this would reduce the transmission intensity. Moreover, as this large crystallite accumulates more and more, the film would crack and some micro-size pieces would detach from the substrate.

In one embodiment of the present invention, it was found that the sapphire thin film on quartz substrate can be annealed at 1150° C. to 1300° C. within half to two hours. The film thickness would shrink by about 10% and the film hardness is improved to 8-8.5 Mohs. Since the quartz substrate is single crystal $SiO_2$ with melting point of 1610°

C., it can resist such high annealing temperature. Under this annealing temperature, the hardness of annealed sapphire thin film on quartz substrate has achieved 8.5 Mohs.

Figure 6:
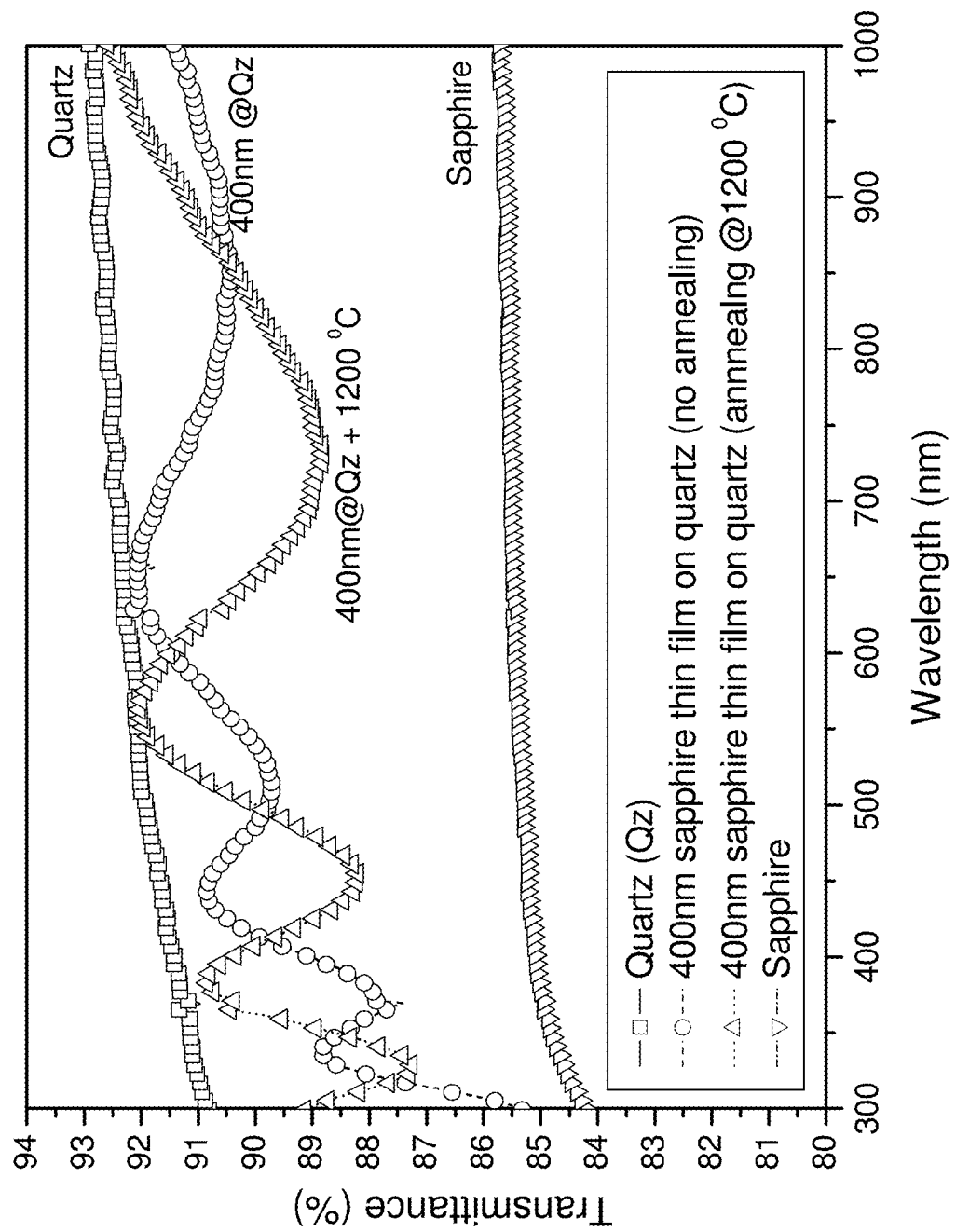
FIG. 6 shows the transmission spectrum of 400 nm sapphire thin film on quartz by e-beam with and without annealing at 1200° C. for 2 hours comparing with quartz and sapphire substrates.

The light transmission of 400 nm Sapphire thin film on Quartz with and without annealing at 1200° C. with 2 hours are shown in FIG. 6 while comparing to quartz and sapphire substrates. The light transmission of Sapphire thin film on Quartz within visible region, from 400-700 nm, is greater than 88% and maximum at 550 nm with 92%. The interference pattern is due to the differences in refractive index of the materials and the film thickness. The overall averaging light transmittance is about 90% while pure sapphire substrate is only 85-86%. Moreover, the light transmission spectrum of Sapphire thin film on Quartz coincides with that of quartz substrate at certain wavelength which indicates the optical performance is excellent and low scattering lost. The difference between maximum and minimum intensity of the interference pattern is about 4% only. For real applications, more light transmitted indicates more energy saved from backlight-source of display panel, so such that the device battery life would be longer.

Thickness of Sapphire Thin Film on Quartz

The Sapphire thin film on Quartz with thickness in the range of 150-1000 nm has been tested. In one embodiment of the present invention, there is provided only sapphire thin film with thickness of 150 nm-500 nm have good optical performance with low scattering lost when annealing temperature is from 1150° C. to 1300° C. However when the thickness is larger than 600 nm, the film would crack causing significant scattering which reduces the transmission intensity.

For the sapphire thin film with thickness of 150 nm-500 nm deposited on quartz after annealing at 1150° C. to 1300° C., all the measured hardness can achieve 8-8.5 in Mohs scale which indicates that even thinner coating film also can act as an anti-scratching layer.

Other Possible Substrates for Anti-Scratch Coating

Apart from quartz substrate, other embodiments of the present invention have also investigated the deposition of sapphire thin film on different substrates such as fused silica and silicon. Other tempered glass or transparent ceramic substrates with higher annealing or melting temperature, which can resist 850° C. annealing temperature within 30 minutes to 2 hours, are also possible to use as substrates to enhance their surface hardness to 7-8 in Mohs hardness scale. For examples, Schott Nextrema transparent ceramics has short heating temperature at 925° C.; Corning Gorilla glass has softening temperature up to 850° C.

Figure 7:
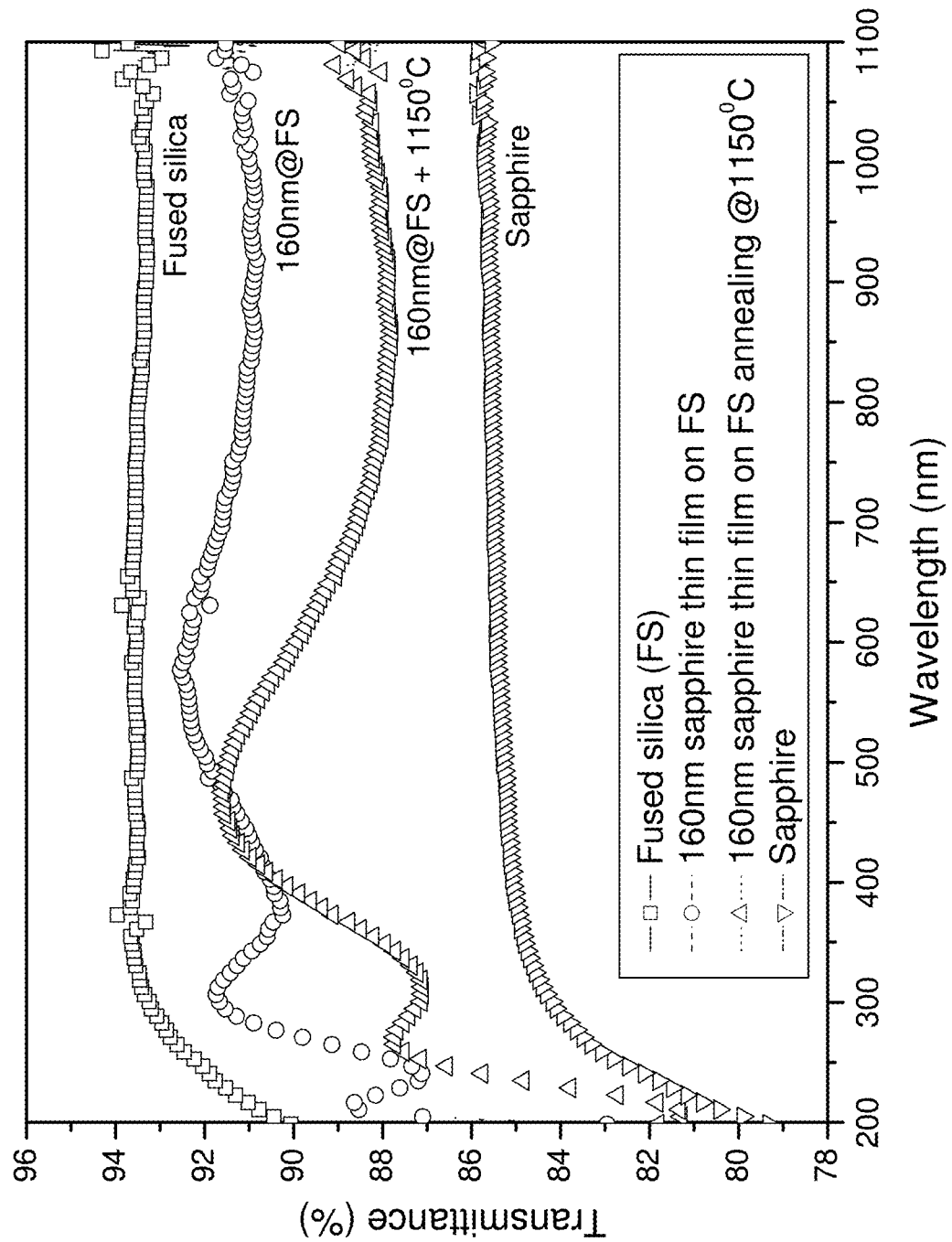
FIG. 7 shows the transmission spectrum of 160 nm sapphire thin film on fused silica by e-beam with and without annealing at 1150° C. for 2 hours comparing with quartz and sapphire substrates.

Since the annealing temperature of fused silica is about 1160° C., it is a good candidate to start investigates its suitability as substrate. However, sapphire thin film on fused silica shows different behaviors compared with sapphire thin film on quartz annealing from 850° C. to 1150° C., even though they are deposited with same deposition condition. The adhesion of sapphire film on fused silica is not good as on quartz (or due to significant difference on the expansion coefficient), localize delamination and micro-sized crack of the film occur on fused silica substrate. However, using thinner film, these problems, which can lead to light scattering has greatly improved. FIG. 7 showed the transmission of 160 nm sapphire thin film on fused silica annealed at 1150° C. for 2 hours. The transmission of sapphire thin film on fused silica in whole visible region from 400 nm-700 nm is greater than 88.5% and maximally 91.5% at 470 nm. The overall averaging light transmittance percentage is about 90% while pure sapphire substrate is only 85%-86%. Moreover, the measured surface hardness also maintains at above 8 in Mohs scale.

Silicon, which has its melting temperature at about 1410° C., is a non-transparent substrate as substrate. From same deposition condition, sapphire film on silicon shows similar characteristics in Mohs hardness comparing to quartz substrate, which also divided into the two groups of temperature range. However silicon is not a transparent substrate, thus it cannot be used as transparent cover glass or window application. Therefore, the sapphire film can only provide the anti-scratch purpose as a protection layer to protect the silicon surface from scratch (silicon has Mohs scale hardness of 7). Such protection layer can potentially eliminate thick glass encapsulation. This would improve the light absorption thus increase the light harvesting efficiency. Other inorganic semiconductor-based solar cell that can withstand high temperature treatment can also have similar deposition of the sapphire thin film onto it. From the embodiments of the present invention as described herein, it is envisaged that a person skilled in the art can very well apply the current invention to deposit sapphire thin film on to other substrates such that the sapphire thin film will act as a anti-scratch protection layer to its underlying substrate provided these substrates can withstand the annealing temperatures of the current invention for the applicable duration of time.

Annealed Sapphire Thin Film by Sputtering Deposition

Sapphire Thin Film by Sputtering Deposition

The steps on sapphire thin film deposition on a given substrate by sputtering deposition is given as follows:

1) The deposition of sapphire thin film can be performed by sputtering deposition using aluminum or aluminum oxide targets.
2) The substrates are attached onto the sample holder which is around 95 mm away from the target. The sample holder is rotated to achieve thickness uniformity when the deposition takes place, example rate is 10 RPM.
3) The base vacuum of evaporation chamber is less than $3\times10^{-6}$ mbar and the coating pressure is around $3\times10^{-3}$ mbar.
4) The thickness of film deposited on substrates is about 150 nm to 600 nm.
5) Higher temperature film deposition is possible from room temperature to 500° C.

Annealing Process

After deposition of sapphire thin film on substrates, they are annealed by a furnace from 500° C. to 1300° C. The temperature raising rate is 5° C./min and the decline rate is 1° C./min. The time is ranged from 30 minutes to 2 hours maintaining at a particular thermal annealing temperature. Multiple-step annealing at different temperatures are also used to enhance the hardness and also reduce the micro-crack of thin film. This is shown in Table 5.

TABLE 5

The surface hardness and XRD characteristic peaks at different annealing temperatures for the sapphire film on quartz prepared by sputtering deposition.

| Annealing Temperature (° C.) | Thickness (nm) | Surface hardness (Mohs) | XRD peaks (phase) | Transmission |
|---|---|---|---|---|
| No annealing | | 6-6.5 | No | |
| 500-850 | | 6-6.5 | No | |

TABLE 5-continued

The surface hardness and XRD characteristic peaks at different annealing temperatures for the sapphire film on quartz prepared by sputtering deposition.

| Annealing Temperature (° C.) | Thickness (nm) | Surface hardness (Mohs) | XRD peaks (phase) | Transmission |
|---|---|---|---|---|
| 850-1150 | 340-600 | Film delamination | theta & delta | |
| 1150-1300 | 150-300 | 8-8.5 | theta & delta | Low scattering 90% |
| | 300-500 | 8.5-8.8 | alpha & theta; alpha only | High scattering 83-87% |

Table 5 shows the changes of surface hardness of sapphire thin film on quartz as annealing temperature varies from 500° C. to 1300° C. In fact, the initial value of hardness of sapphire thin film without annealing by sputtering deposition is slightly higher than that by e-beam deposition; about 6-6.5 Mohs. After doing thermal annealing process, the performance of film hardness is different from that by e-beam deposition. When annealing temperature is in the range 500° C.-850° C., the film hardness has no significant change. For 850° C.-1150° C. range, the thin film coated on quartz is easily delaminated. However, in 1150° C.-1300° C. range, the film forms hard film, with its surface hardness has 8-8.5 Mohs for thickness 150 nm-300 nm and 8.5-8.8 Mohs for thicknesses 300 nm-500 nm.

Figure 8A:
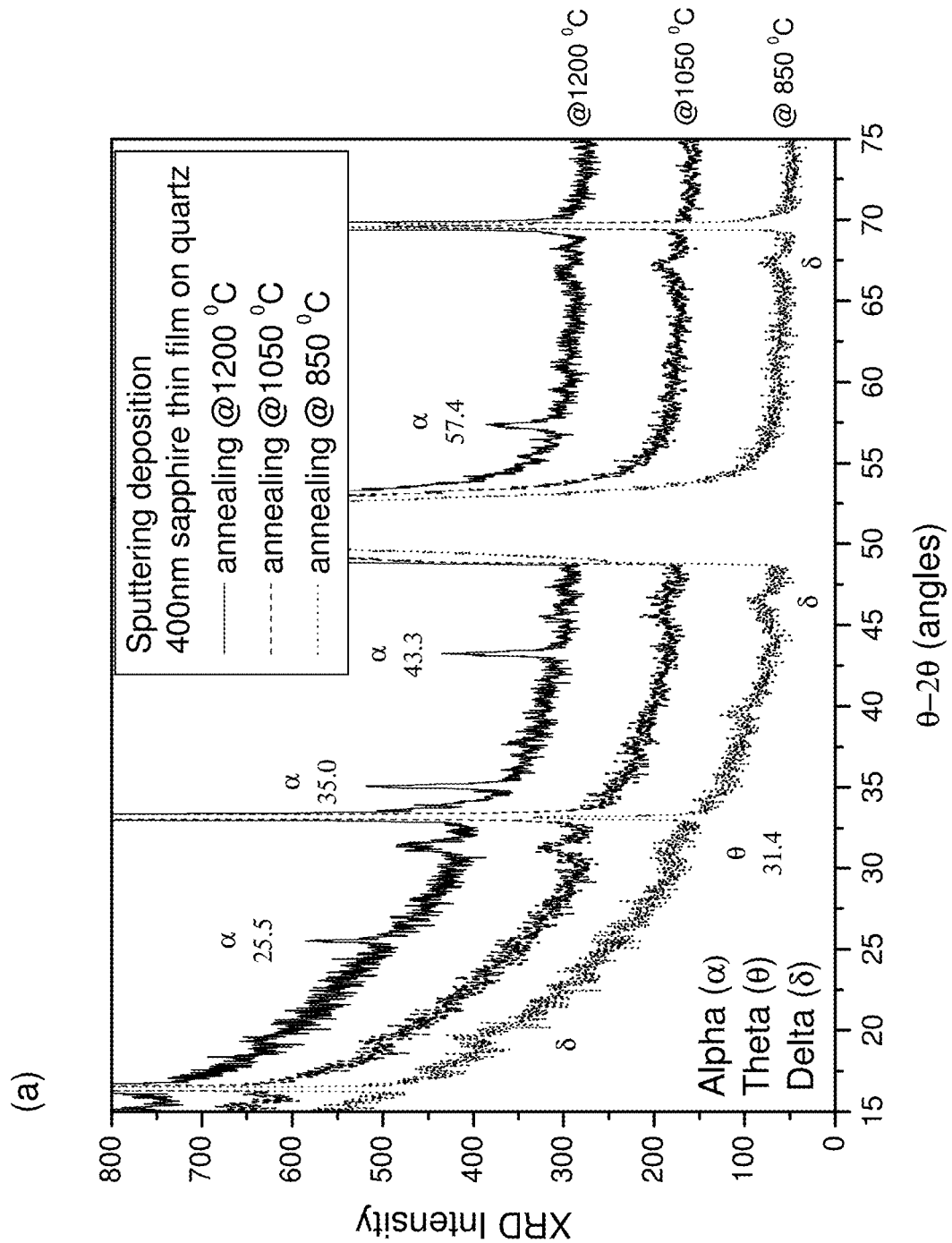
FIG. 8A shows XRD results for the 400 nm sapphire thin film on quartz prepared by sputtering deposition and annealing at 850° C., 1050° C. and 1200° C. for 2 hours.
Figure 8B:
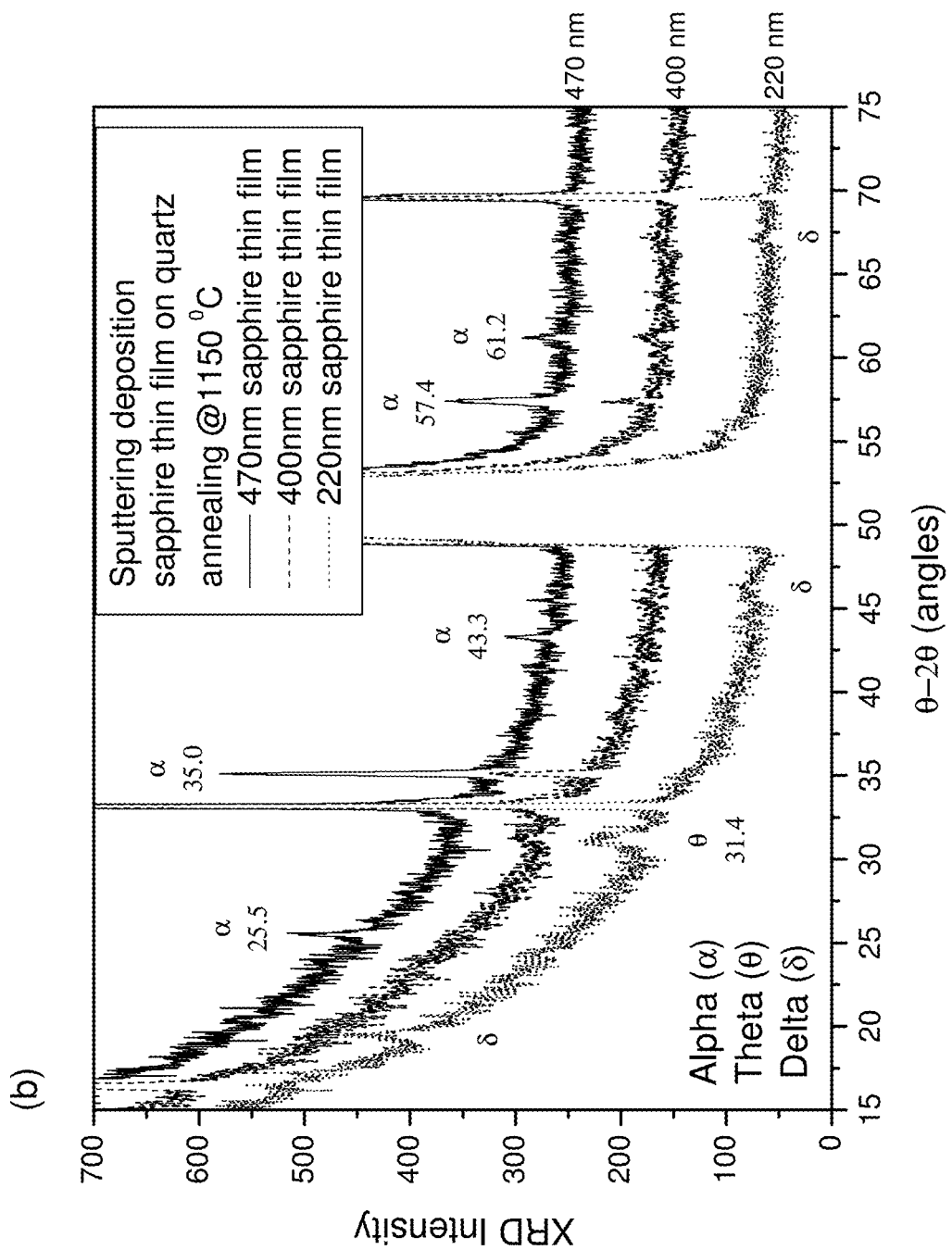
FIG. 8B shows XRD results for the sapphire thin film with thicknesses of 220 nm, 400 nm and 470 nm on quartz prepared by sputtering deposition and annealing at 1150° C. for 2 hours.
Figure 9:
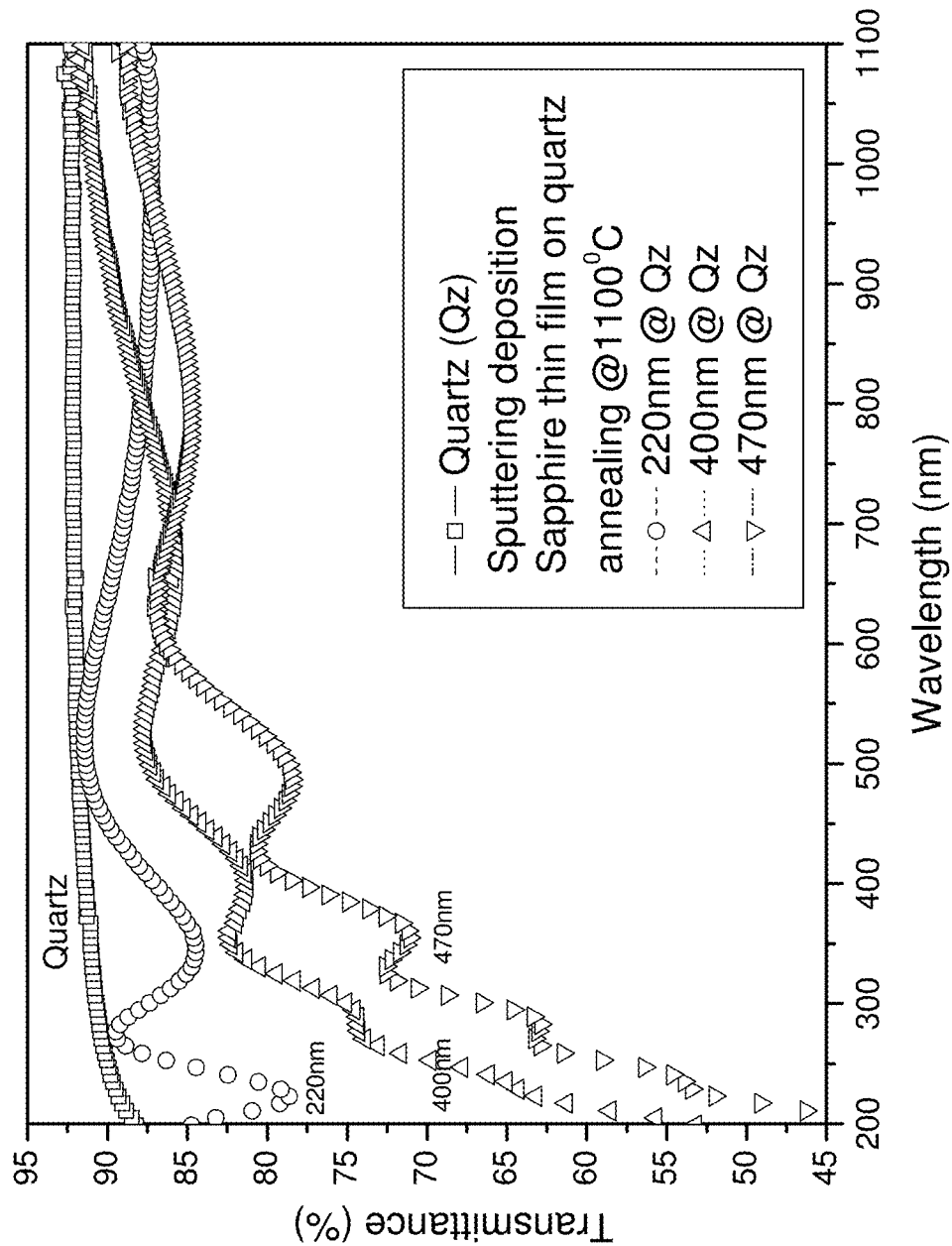
FIG. 9 shows the transmission spectra of 220 nm, 400 nm and 470 nm sapphire thin film on quartz by sputtering deposition and annealing at 1100° C. for 2 hours comparing with quartz substrate.

FIG. 8A shows XRD results for the 400 nm sapphire thin films on quartz annealing at 850° C., 1050° C. and 1200° C. for 2 hours. The occurring XRD peaks are corresponding to the mixing of delta, theta and alpha structural phases of aluminum oxide. Differently from e-beam evaporation, the occurrence of alpha phase of aluminum oxide in XRD result for sputtering deposition cause more hardened surface hardness, scoring 8.7 Mohs in average. While FIG. 8B shows XRD results for the sapphire thin film with thicknesses of 220 nm, 400 nm and 470 nm on quartz annealing at 1150° C. for 2 hours. The occurrence of alpha phase starts from about 300 nm and when the thickness of sapphire thin film increases up to 470 nm, the original mixing of structural phases almost converts to alpha phase. The surface hardness is the hardest under such conditions. However, further increasing the thickness of sapphire thin film would cause film delamination.

The light transmission spectra of 220 nm, 400 nm and 470 nm sapphire thin film on quartz prepared by sputtering deposition annealing at 1150° C. with 2 hours are showed in FIG. 6 while comparing to quartz substrate. For annealed 220 nm sapphire thin film on quartz, the optical performance is excellent and with a little scattering lost. The transmission in whole visible region from 400 nm-700 nm is greater than 87% and maximally 91.5% at 520 nm. The overall averaging transmittance is about 90.2%. The difference between maximum and minimum intensity of the interference pattern is about 4.5% only.

However, when the thickness of sapphire thin film is greater than 300 nm, the light transmittance intensity starts to drop especially in UV range indicating that Rayleigh scattering starts to dominate. The strong wavelength dependence of Rayleigh scattering ($\sim\lambda^{-4}$) applies to the scattering particle with particle size which is less than 1/10 wavelength. This is due to the formation of alpha phase in sapphire thin film with sub-100 nm crystalline size. Therefore, the surface hardness becomes harder but the transmission becomes worse.

For annealed 400 nm and 470 nm sapphire thin film on quartz, the light transmission percentage in whole visible region from 400 nm-700 nm is within 81%-88% and 78%-87% respectively. Their overall averaging transmittance values are about 85.7% and 83.0% respectively.

However, when the thickness of sapphire thin film is greater than 500 nm, larger crystallite accumulates with micro-cracks form, the film would crack and some micro-size pieces would detach from the substrate.

Sapphire Thin Film on Fused Silica by Sputtering Deposition

Apart from quartz substrate, low cost fused silica is a potential candidate for sapphire thin film coated substrates since the annealing temperature of fused silica is about 1160° C.

Table 6 showed the surface hardness of sapphire thin film on fused silica as annealing temperature varies from 750° C. to 1150° C. In fact, the initial value of hardness of sapphire thin film on fused silica without annealing by sputtering deposition is slightly lower than that on quartz; about 5.5-6 Mohs. For 850° C.-1150° C. range, the hardness is even worse, less than 5 Mohs for all 150 nm-600 nm sapphire thin films. However, at 1150° C., the film can form hard film again, which its surface hardness has 8-8.5 for all 150 nm-600 nm sapphire thin films.

TABLE 6

The surface hardness and XRD characteristic peaks at different annealing temperatures for the sapphire film on fused silica prepared by sputtering deposition.

| Annealing Temperature (° C.) | Thickness (nm) | Surface hardness (Mohs) | XRD peaks (phase) | Transmission |
|---|---|---|---|---|
| No annealing | | 5.5-6 | No | |
| 850-1150 | 150-600 | <5 | theta & delta | |
| 1150-1300 | 150-300 | 8-8.5 | theta & delta | Low scattering 91% |
| | 300-600 | 8-8.5 | alpha & theta; alpha only | High scattering 74-82% |

Figure 10:
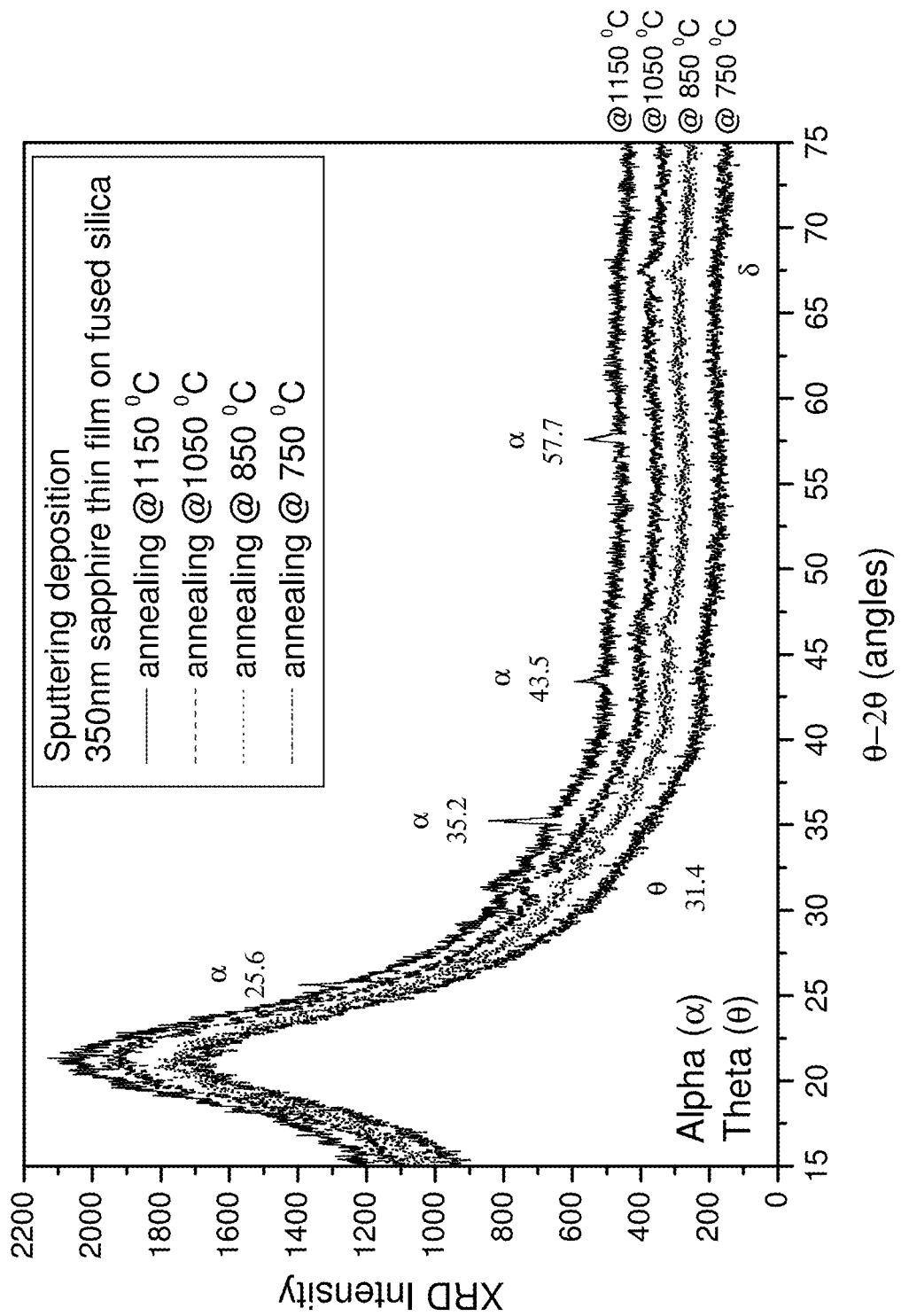
FIG. 10 shows XRD results for the 350 nm sapphire thin film on fused silica prepared by sputtering deposition and annealing at 750° C., 850° C., 1050° C. and 1150° C. for 2 hours.

FIG. 10 shows XRD results for the 350 nm sapphire thin film on fused silica prepared by sputtering deposition and annealing at 750° C., 850° C., 1050° C. and 1150° C. for 2 hours. XRD results show the mixing of theta and alpha structural phases of aluminum oxide co-exist on the fused silica substrate. Therefore, the sapphire thin film has a hard surface with 8-8.5 Mohs, whereas fused silica substrate has only scores 5.3-6.5.

Figure 11:
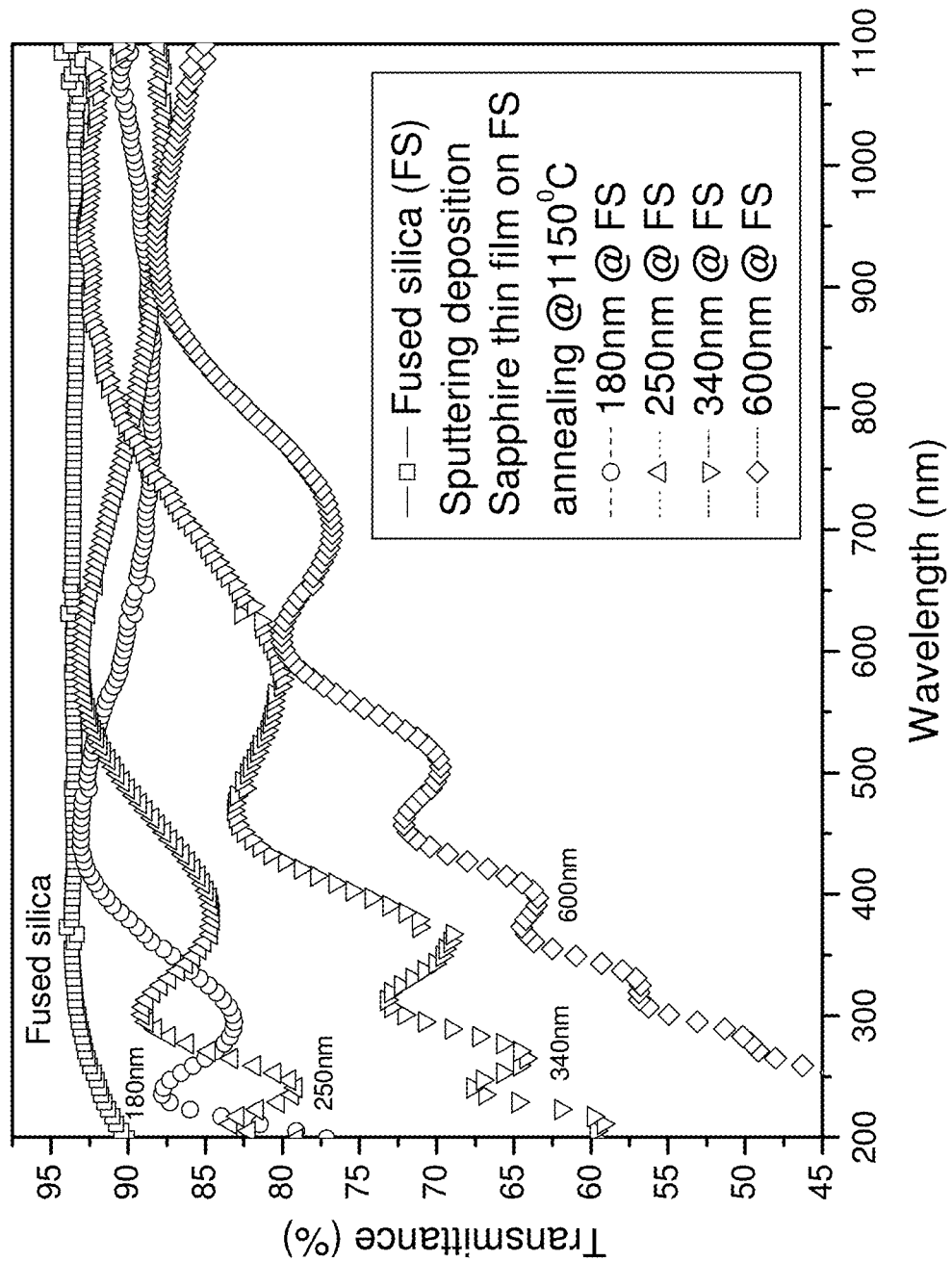
FIG. 11 shows the transmission spectra of 180 nm-600 nm sapphire thin film on fused silica by sputtering deposition and annealing at 1150° C. for 2 hours comparing with fused silica substrate.

The transmission spectra of 180 nm-600 nm sapphire thin film on fused silica prepared by sputtering deposition annealing at 1150° C. with 2 hours showed in FIG. 11 compared to fused silica substrate.

For annealed 180 nm and 250 nm sapphire thin film on fused silica, the optical performance is excellent and with a little scattering lost. The transmission of sapphire thin film in whole visible region from 400-700 nm is within 88.9%-93.1% and 84.8%-92.8% respectively. Their overall averaging transmittance values are about 91.3% and 90.7% respectively.

For annealed 340 nm and 600 nm thick sapphire thin film on fused silica, the transmission across visible region from 400 nm-700 nm is within 75%-86% and 64%-80% respectively. Their overall averaging transmittance is about 81.7% and 74.1% respectively.

Therefore, annealed sapphire thin film on fused silica at 1150° C. with thickness of 150 nm-300 nm has good optical performance with about 91% transmittance and also has strong surface hardness with >8 Mohs.

INDUSTRIAL APPLICABILITY

The present invention relates to method to deposit a layer of harder thin film substrate onto a softer substrate. In particular, the present invention provides a method to deposit a layer of sapphire thin film onto a softer substrate e.g. quartz, fused silica, silicon and (toughen) glass. This combination is better than pure sapphire substrate.

If desired, the different functions discussed herein may be performed in a different order and/or concurrently with each other. Furthermore, if desired, one or more of the above-described functions may be optional or may be combined.

Throughout this specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. patent law; e.g., they can mean "includes", "included", "including", and the like; and that terms such as "consisting essentially of" and "consists essentially of" have the meaning ascribed to them in U.S. patent law, e.g., they allow for elements not explicitly recited, but exclude elements that are found in the prior art or that affect a basic or novel characteristic of the invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

Other definitions for selected terms used herein may be found within the detailed description of the invention and apply throughout. Unless otherwise defined, all other technical terms used herein have the same meaning as commonly understood to one of ordinary skill in the art to which the invention belongs.

While the foregoing invention has been described with respect to various embodiments and examples, it is understood that other embodiments are within the scope of the present invention as expressed in the following claims and their equivalents. Moreover, the above specific examples are to be construed as merely illustrative, and not limitative of the reminder of the disclosure in any way whatsoever. Without further elaboration, it is believed that one skilled in the art can, based on the description herein, utilize the present invention to its fullest extent. All publications recited herein are hereby incorporated by reference in their entirety.

Citation or identification of any reference in this section or any other section of this document shall not be construed as an admission that such reference is available as prior art for the present application.

What we claim:

1. A method for coating sapphire on to a substrate comprising,
    an e-beam evaporation or sputtering deposition process at room temperature, wherein sapphire is deposited directly on to a substrate selected from quartz, fused silica, silicon, glass, or toughened glass to form a sapphire coated substrate, wherein the substrate during deposition is without external cooling or heating; and
    at least one anneal process, wherein said sapphire coated substrate is annealed under an annealing temperature ranging between 500° C. and 2040° C. for an effective duration of time.

2. The method according to claim 1, wherein said substrate comprises at least one material with a Mohs value less than that of said sapphire.

3. The method according to claim 1, wherein said sapphire is deposited as a sapphire thin film on to said substrate.

4. The method according to claim 3, wherein a thickness of said substrate is of one or more orders of magnitude greater than a thickness of said sapphire thin film.

5. The method according to claim 4, wherein said sapphire thin film has the thickness between 150 nm and 600 nm.

6. The method according to claim 4, wherein said sapphire thin film has the thickness between 150 nm and 300 nm.

7. The method according to claim 3, wherein a thickness of said sapphire thin film is about $1/1000$ of a thickness of said substrate.

8. The method according to claim 1, wherein said effective duration of time is no less than 30 minutes and no more than 2 hours.

9. The method according to claim 1, wherein said at least one anneal process has a temperature raising rate of 5° C. per minute and a temperature declining rate of 1° C. per minute.

10. The method according to claim 1, wherein said annealing temperature ranges between 850° C. and 1300° C.

11. The method according to claim 1, wherein said annealing temperature ranges between 1150° C. and 1300° C.

12. A method for protecting a surface of a substrate by coating said surface with sapphire using the method according to claim 1.

13. The method according to claim 12, wherein said surface allows light to pass through.

14. A screen fabricated by using the method according to claim 1 for use in displays.

15. The screen according to claim 14, wherein said screen is used as one or more interfaces in electronic or digital devices.

16. The screen according to claim 14, wherein said screen is scratch resistant, shatter resistant, and light in weight.

17. The screen according to claim 14, wherein said screen allows light to pass through.

* * * * *